(12) United States Patent
Son et al.

(10) Patent No.: US 12,100,329 B2
(45) Date of Patent: Sep. 24, 2024

(54) DISPLAY DEVICE

(71) Applicant: SAMSUNG DISPLAY CO., LTD., Yongin-si (KR)

(72) Inventors: Sun Kwun Son, Suwon-si (KR); Dong Hee Shin, Anyang-si (KR); Na Hyeon Cha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/062,809

(22) Filed: Dec. 7, 2022

(65) Prior Publication Data

US 2023/0267867 A1 Aug. 24, 2023

(30) Foreign Application Priority Data

Feb. 21, 2022 (KR) .................. 10-2022-0022382

(51) Int. Cl.
*G09G 3/20* (2006.01)
(52) U.S. Cl.
CPC ....... *G09G 3/2003* (2013.01); *G09G 2300/04* (2013.01); *G09G 2300/0809* (2013.01)
(58) Field of Classification Search
CPC ....... G09G 2300/04; G09G 2300/0809; G09G 3/2003; H10K 59/121
See application file for complete search history.

(56) References Cited

U.S. PATENT DOCUMENTS

| 11,063,097 | B2* | 7/2021 | Baek ............. H10K 59/352 |
| 2014/0145156 | A1* | 5/2014 | Choi ............. H10K 71/621 438/34 |
| 2016/0111487 | A1* | 4/2016 | Jeong ............ H10K 59/1315 257/40 |
| 2017/0053972 | A1* | 2/2017 | Kim ............. H10K 59/121 |
| 2017/0294492 | A1* | 10/2017 | Lv ............... H10K 50/828 |
| 2020/0176530 | A1* | 6/2020 | Baek ............. H01L 27/156 |
| 2020/0203453 | A1* | 6/2020 | Kim ............. H10K 59/131 |
| 2021/0183904 | A1* | 6/2021 | Kim ............. H01L 27/1218 |
| 2022/0208865 | A1* | 6/2022 | Youn ............ H10K 59/121 |
| 2022/0284848 | A1 | 9/2022 | Cha et al. |
| 2023/0172017 | A1* | 6/2023 | Lee ............. H10K 59/121 257/91 |

FOREIGN PATENT DOCUMENTS

| CN | 115083266 A | 9/2022 |
| KR | 10-2017-0089460 A | 8/2017 |
| KR | 10-2019-0081100 A | 7/2019 |
| KR | 10-2021-0013493 A | 2/2021 |
| KR | 10-2021-0086907 A | 7/2021 |

* cited by examiner

*Primary Examiner* — Kenneth Bukowski
(74) *Attorney, Agent, or Firm* — Lewis Roca Rothgerber Christie LLP

(57) ABSTRACT

A display device is provided. The display device includes a first pixel including a first light emission area, a second pixel adjacent to the first pixel in a column direction, and including a second light emission area, a transistor area overlapped with each of the first pixel and the second pixel, and coupled to the first light emission area and the second light emission area, and a light-transmissive area adjacent to the transistor area in a row direction crossing the column direction.

20 Claims, 10 Drawing Sheets

DISPLAY DEVICE

CROSS-REFERENCE TO RELATED APPLICATION

This application claims priority to, and the benefit of, Korean Patent Application No. 10-2022-0022382 filed on Feb. 21, 2022 in the Korean Intellectual Property Office, the contents of which in its entirety are herein incorporated by reference.

BACKGROUND

1. Field

The present disclosure relates to a display device.

2. Description of the Related Art

Display devices are becoming increasingly important with the development of multimedia. Accordingly, various types of display devices, such as organic light emitting displays (OLEDs) and liquid crystal displays (LCDs), are being used.

As a device for displaying an image of a display device, there is a self-luminous display device including a light emitting element. The self-luminous display device may be an organic light emitting display using an organic material as a light emitting material of a light emitting element, or using an inorganic light emitting display using an inorganic material of a light emitting material.

SUMMARY

Aspects of the disclosure provide a display device in which light-transmissive areas of adjacent pixels are incorporated.

However, aspects of the disclosure are not restricted to the one set forth herein. The above and other aspects of the disclosure will become more apparent to one of ordinary skill in the art to which the disclosure pertains by referencing the detailed description of the disclosure given below.

According to one or more embodiments of the disclosure, a display device includes a first pixel including a first light emission area, a second pixel adjacent to the first pixel in a column direction, and including a second light emission area, a transistor area overlapped with each of the first pixel and the second pixel, and coupled to the first light emission area and the second light emission area, and a light-transmissive area adjacent to the transistor area in a row direction crossing the column direction.

The transistor area may overlap the first light emission area and the second light emission area.

The transistor area may include a first transistor area overlapped with the first light emission area, and a second transistor area overlapped with the second light emission area.

An overlap area between the first light emission area and the first transistor area may have a same size as a size of an overlap area between the second light emission area and the second transistor area.

The first transistor area may include first transistors electrically connected to the first light emission area, wherein the second transistor area includes second transistors electrically connected to the second light emission area.

The light-transmissive area may include a first light-transmissive area, and a second light-transmissive area adjacent to the first light-transmissive area in the column direction.

The first light-transmissive area and the second light-transmissive area may be spaced apart from each other with a gap space therebetween.

The display device may further include at least one line extending along the row direction is in the transistor area and in the gap space.

The at least one line may be connected to one of the first transistors or one of the second transistors.

The at least one line may include a scan line or a power line.

The first pixel may include a portion of the first light-transmissive area and a first portion of the second light-transmissive area, wherein the second pixel includes a second portion of the second light-transmissive area.

The first transistor area and the second transistor area may have a symmetrical shape along the column direction.

The first pixel and the second pixel may be repeatedly arranged along the column direction.

According to one or more embodiments of the disclosure, a display device includes a first pixel including a first light emission area, a second pixel adjacent to the first pixel in a column direction, and including a second light emission area, a first transistor area including a (1-1)th transistor area overlapped with the first light emission area, and a (1-2)th transistor area overlapped with the second light emission area, and a first light-transmissive area adjacent to the first transistor area in a row direction crossing the column direction, and including a (1-1)th light-transmissive area, and a second light-transmissive area including a (2-1)th light-transmissive area adjacent to the (1-1)th light-transmissive area in the column direction, and spaced from the (1-1)th light-transmissive area with a gap space therebetween, wherein the first pixel further includes a portion of the first light-transmissive area, a first portion of the second light-transmissive area, and the (1-1)th transistor area, and wherein the second pixel further includes a second portion of the second light-transmissive area, and the (1-2)th transistor area.

An overlap area between the first light emission area and the (1-1)th transistor area may have a same size as a size of an overlap area between the second light emission area and the (1-2)th transistor area.

The display device may further include at least one line extending along the row direction in the first transistor area and in the gap space.

The at least one line may be connected to a first transistor of the (1-1)th transistor area or a second transistor of the (1-2)th transistor area, and may include a scan line or a power line.

The display device may further include a third pixel including a third light emission area, a fourth pixel adjacent to the third pixel in the column direction, and including a fourth light emission area, and a second transistor area including a (2-1)th transistor area overlapped with the third light emission area, and a (2-2)th transistor area overlapped with the fourth light emission area, wherein the first light-transmissive area and the second light-transmissive area respectively further include a (1-2)th light-transmissive area and (2-2)th light-transmissive area adjacent to the second transistor area in the row direction.

The (1-2)th light-transmissive area and the (2-2)th light-transmissive area may be adjacent to each other in the column direction, and spaced apart from each other, wherein the third pixel further includes a portion of the (1-2)th light-transmissive area and a first portion of the (2-2)th light-transmissive area, and wherein the fourth pixel further includes a second portion of the (2-2)th light-transmissive area.

The first pixel and the second pixel may be repeatedly arranged along the column direction, wherein the third pixel and the fourth pixel are repeatedly arranged along the column direction, and wherein an arrangement of the first pixel and the second pixel and an arrangement of the third pixel and the fourth pixel have a substantially symmetrical shape along the row direction.

In the display device according to one or more embodiments, light-transmissive areas of adjacent pixels may be incorporated, whereby light transmittance may be enhanced.

However, the aspects of the disclosure are not limited to the aforementioned aspects, and various other aspects are included in the specification.

BRIEF DESCRIPTION OF THE DRAWINGS

The above and other aspects of the present disclosure will become more apparent by describing in detail embodiments thereof with reference to the attached drawings, in which.

DETAILED DESCRIPTION

Figure 1:
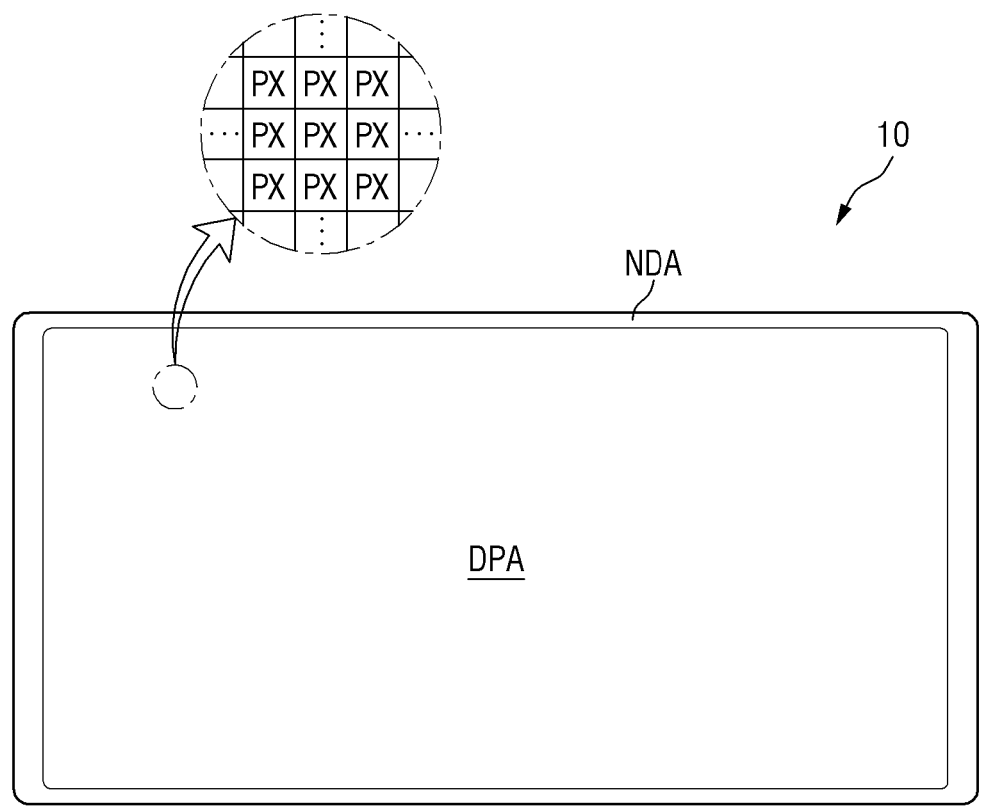
FIG. 1 is a schematic plan view illustrating a display device according to one or more embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, "or" generally means "and/or," and the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic plan view illustrating a display device according to one or more embodiments of the present disclosure.

In the present disclosure, "upper," "top," and "upper surface" may refer to an upper direction, that is, one direction of a third direction DR3 with respect to a display device 10, and "lower," "bottom," and "lower surface" may refer to the other direction of the third direction DR3. Also, "left," "right," "upper" and "lower" refer to a direction when the display device 10 is viewed on a plane. For example, "left" refers to one direction of a first direction DR1, "right" refers to the other direction of the first direction DR1, "upper" may refer to one direction of a second direction DR2, and "lower" may refer to the other direction of the second direction DR2.

Referring to FIG. 1, the display device 10 displays a moving image or a still image. The display device 10 may refer to all electronic devices that provide a display screen. For example, a television, a laptop computer, a monitor, an advertising board, Internet of Things, a mobile phone, a smart phone, a tablet personal computer (PC), an electronic watch, a smart watch, a watch phone, a head mounted display, a mobile communication terminal, an electronic diary, an electronic book, a portable multimedia player (PMP), a navigator, a game machine, a digital camera, a camcorder and the like may be included in the display device 10.

The display device 10 includes a display panel for providing a display screen. Examples of the display panel include an inorganic light emitting diode display panel, an organic light emitting display panel, a quantum dot light emitting display panel, a plasma display panel, and a field emission display panel. Hereinafter, an inorganic light emitting diode display panel is applied as an example of a display panel, but is not limited thereto. Another display panel may be used when the same technical spirits are applicable thereto.

Various modifications may be made in a shape of the display device 10. For example, the display device 10 may have a rectangular shape that is longer in a horizontal direction, a rectangular shape that is longer in a vertical direction, a square shape, a rectangular shape with rounded corners (vertexes), other polygonal shape, a circular shape, etc. A shape of a display area DPA of the display device 10 may be also similar to the overall shape of the display device 10. The display device 10 and the display area DPA that are longer in the horizontal direction are illustrated in FIG. 1.

The display device 10 may include a display area DPA and a non-display area NDA. The display area DPA is an area in which a screen may display an image, and the non-display area NDA is an area in which no image is displayed. The display area DPA may be referred to as an active area, and the non-display area NDA may be referred to as a non-active area. The display area DPA may generally occupy the center of the display device 10.

The display area DPA may include a plurality of pixels PX. The plurality of pixels PX may be arranged in a matrix direction. A shape of each pixel PX may be a rectangular or square shape on a plane, but is not limited thereto. The shape of each pixel PX may be a rhombus shape in which each side is inclined with respect to one direction. The respective pixels PX may be alternately arranged in a stripe type or a PENTILE™ type, which may be referred to as an RGBG matrix structure (e.g., a PENTILE™ matrix structure, a PENTILE™ structure, or an RGBG structure, PENTILE™ being a registered trademark of Samsung Display Co., Ltd., Republic of Korea). Each of the pixels PX may include one or more light emitting elements 30 for emitting light of a corresponding wavelength range to display a corresponding color.

The non-display area NDA may be located in the vicinity of the display area DPA. The non-display area NDA may fully or partially surround the display area DPA. The display area DPA may be rectangular in shape, and the non-display area NDA may be located to be adjacent to four sides of the display area DPA. The non-display area NDA may constitute a bezel of the display device 10. Lines or circuit drivers included in the display device 10 may be located in the non-display areas NDA, or external devices may be packaged therein.

Figure 2:
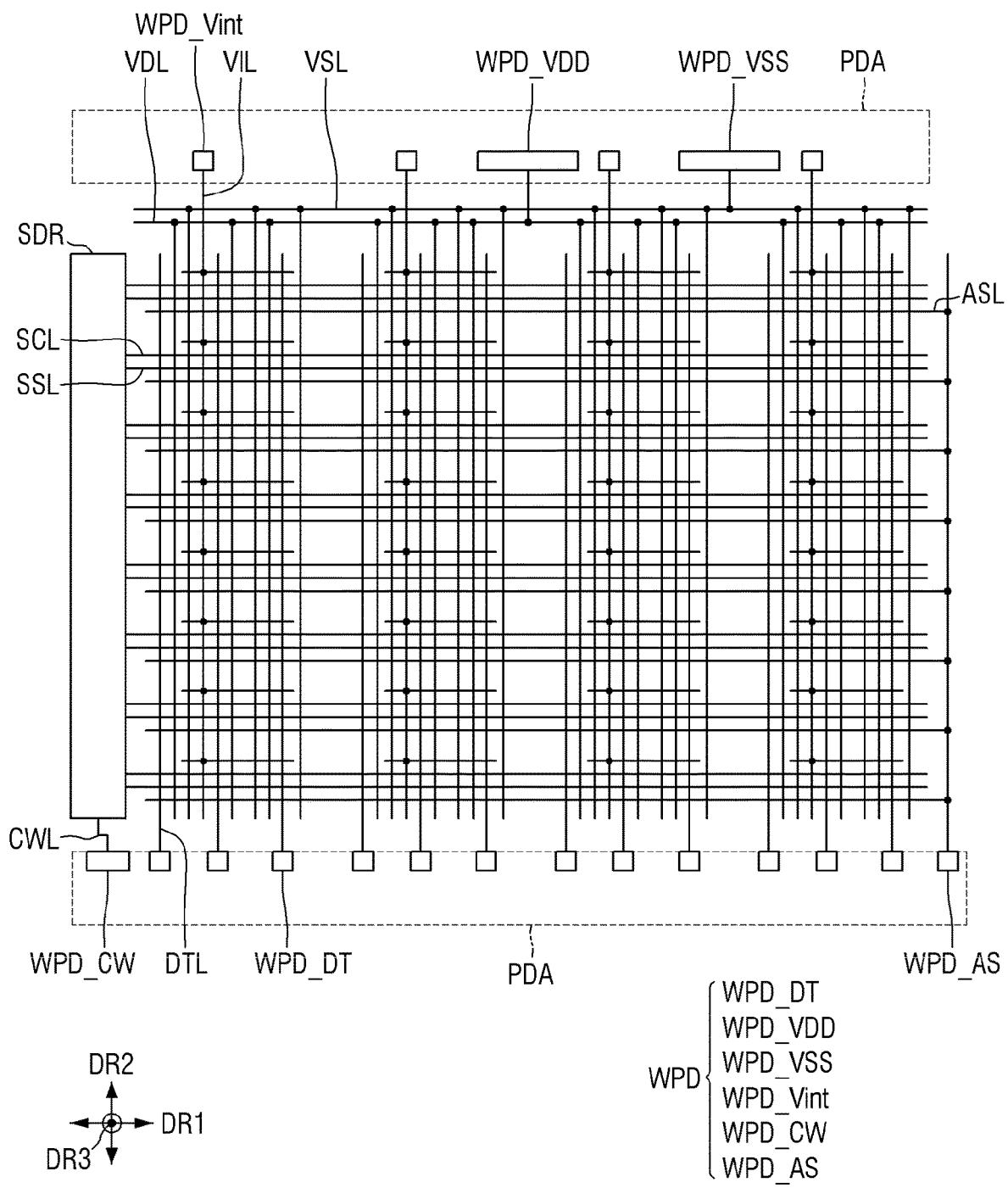
FIG. 2 is a schematic layout view illustrating lines included in a display device according to one or more embodiments.

FIG. 2 is a schematic layout view illustrating lines included in the display device according to one or more embodiments of the present disclosure.

Referring to FIG. 2, the display device 10 may include a plurality of lines. The plurality of lines may include a scan line SCL, a sensing line SSL, a data line DTL, an initialization voltage line VIL, a first voltage line VDL and a second voltage line VSL. Also, the display device 10 may further include other lines in one or more embodiments.

The scan line SCL and the sensing line SSL may extend in the first direction DR1. The scan line SCL and the sensing line SSL may be connected to a scan driver SDR. The scan driver SDR may include a driving circuit. The scan driver SDR may be located on one side of the display area DPA in the first direction DR1, but is not limited thereto. The scan driver SDR may be connected to a signal connection line CWL, and at least one end of the signal connection line CWL may be connected to an external device by forming a pad WPD_CW on the non-display area NDA.

Meanwhile, the meaning of "connection" herein may include that any one member is connected to another member through a third member as well as through a mutual physical contact. Further, it may be understood that one portion and the other portion are interconnected as an integrated member. Furthermore, the connection of any one member to another member may be interpreted in terms of including electrical connection through other member in addition to direct contact connection.

The data line DTL and the initialization voltage line VIL may extend in the second direction DR2 crossing the first direction DR1. The initialization voltage line VIL may further include an extended portion extending in the second direction DR2, and a portion(s) diverged from the extended portion in the first direction DR1. The first voltage line VDL and the second voltage line VSL may also include an extended portion(s) extending in the second direction DR2 and a portion connected to the extended portion(s) and extended in the first direction DR1. The first voltage line VDL and the second voltage line VSL may have a mesh structure, but are not limited thereto. In one or more embodiments, each of the pixels PX of the display device 10 may be connected to at least one data line DTL, the initialization voltage line VIL, the first voltage line VDL, and the second voltage line VSL.

The data line DTL, the initialization voltage line VIL, the first voltage line VDL and the second voltage line VSL may be electrically connected to at least one wiring pad WPD. Each wiring pad WPD may be located in the non-display area NDA. In one or more embodiments, a wiring pad WPD_DT (hereinafter, referred to as 'data pad') of the data line DTL may be located on a pad area PDA on one side in the second direction DR2 of the display area DPA, and a wiring pad WPD_Vint (hereinafter, referred to as 'initialization voltage pad') of the initialization voltage line VIL, a wiring pad WPD_VDD (hereinafter, referred to as 'first power pad') of the first voltage line VDL and a wiring pad WPD_VSS (hereinafter, referred to as 'second power pad') of the second voltage line VSL may be located in the pad area PDA positioned on the other side in the second direction DR2 of the display area DPA. As another example, all of the data pad WPD_DT, the initialization voltage pad WPD_Vint, the first power pad WPD_VDD and the second power pad WPD_VSS may be located in the same area, for example, the non-display area NDA positioned on the upper side of the display area DPA. The external device may be packaged on the wiring pad WPD. The external device may be packaged on the wiring pad WPD via an anisotropic conductive film, an ultrasonic bonding or the like.

Each pixel PX of the display device 10 includes a pixel driving circuit. The above-described lines may apply a driving signal to each pixel driving circuit while passing through each pixel PX or the periphery of the pixel. The pixel driving circuit may include a transistor and a capacitor. Various modifications may be made in the number of transistors and capacitors of each pixel driving circuit. According to one or more embodiments, the pixel PX of the display device 10 may have a 3T1C structure in which a pixel driving circuit includes three transistors and one capacitor. Hereinafter, the pixel driving circuit will be described based on the 3T1C structure by way of example, but is not limited thereto. Other various modified pixel structures, such as a 2T1C structure, a 7T1C structure and a 6T1C structure, may be applied to the pixel driving circuit.

Figure 3:
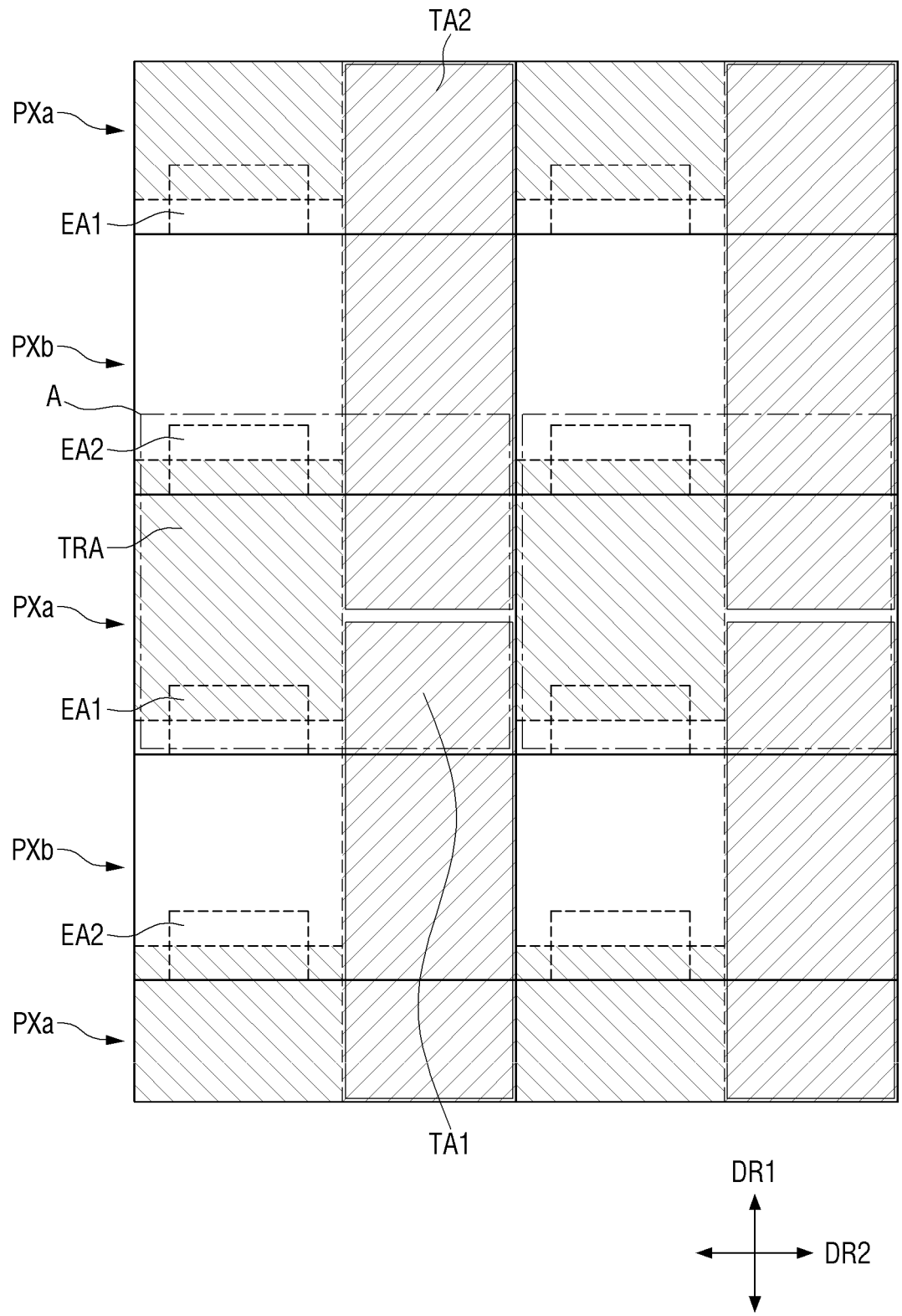
FIG. 3 is a detailed plan view illustrating first and second pixels of FIG. 1.

FIG. 3 is a detailed plan view illustrating first and second pixels of FIG. 1.

Referring to FIG. 3, a pixel PX according to one or more embodiments may include a first pixel PXa including a first light emission area EA1, and a second pixel PXb adjacent to the first pixel PXa in a column direction (first direction DR1 of FIG. 3) and including a second light emission area EA2.

The first pixel PXa and the second pixel PXb may be repeatedly located along a column direction. Furthermore, the arrangement of the first and second pixels PXa and PXb, which are repeatedly located along the column direction, may be repeatedly located along a row direction (second direction DR2 in FIG. 3).

The display device according to one or more embodiments of the present disclosure may further include a transistor area TRA that overlaps the first and second pixels PXa and PXb, respectively, and light-transmissive areas TA1 and TA2 adjacent to the row direction of the transistor area TRA. The first and second emission areas EA1 and EA2 may be connected to the transistor area TRA, respectively.

The transistor area TRA may overlap the first light emission area EA1 and the second light emission area EA2, respectively. As shown in FIG. 3, the first light emission area EA1 may overlap the other end of the transistor area TRA in the first direction DR1, and the second light emission area EA2 may overlap one end of the transistor area TRA in the first direction DR1.

The light emission areas EA1 and EA2 of the respective pixels PXa and PXb may include light emission areas of a corresponding color, which are defined by a pixel defining layer, and may emit light having a peak wavelength (e.g., a predetermined peak wavelength) through the light emission areas of the corresponding color. The light emission areas of the corresponding color may include a red light emission area, a green light emission area, and a blue light emission area.

The red light emission area may emit light of a first color, the green light emission area may emit light of a second color, and the blue light emission area may emit light of a third color. For example, the light of the first color may be red light having a peak wavelength in the range of about 610 nm to about 650 nm, the light of the second color may be green light having a peak wavelength in the range of about 510 nm to about 550 nm and the light of the third color may be blue light having a peak wavelength in the range of about 440 nm to about 480 nm, but the present disclosure is not limited thereto.

The light emission area may include a light-shielding area between the light emission areas of the corresponding color, which are adjacent to each other. For example, the light-shielding area between the light emission areas may surround the light emission areas of the corresponding color.

The light-transmissive areas TA1 and TA2 may include a first light-transmissive area TA1 and a second light-transmissive area TA2, which are adjacent to the column direction.

The first light-transmissive area TA1 and the second light-transmissive area TA2 may be spaced apart from each other with a gap space interposed therebetween.

The first pixel PXa may further include a portion of the first light-transmissive area TA1 and a portion of the second light-transmissive area TA2. The second pixel PXb may include another portion of the second light-transmissive area TA2. The gap space between the first light-transmissive area TA1 and the second light-transmissive area TA2 may be located in the first pixel PXa. That is, the first pixel PXa may include the gap space.

As described above, the first pixel PXa and the second pixel PXb are repeatedly located along the column direction, the first light emission area EA1 overlaps the other end of the transistor area TRA in the first direction DR1, and the second light emission area EA2 overlaps one end of the transistor area TRA in the first direction DR1. As a result, as shown in FIG. 3, spaced distances (d or pitches) between the light emission areas EA1 and EA2 of the first pixel PXa and the second pixel PXb, which are repeatedly located along the column direction, may be designed in the same manner.

Figure 4:
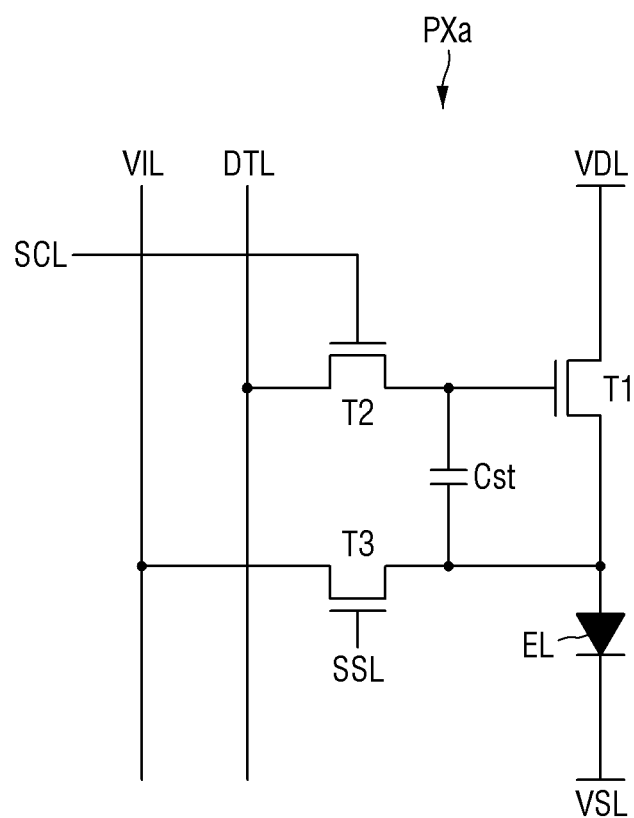
FIG. 4 is an equivalent circuit view illustrating one pixel according to one or more embodiments.

FIG. 4 is an equivalent circuit view illustrating one pixel according to one or more embodiments.

Referring to FIG. 4, each first pixel PXa of the display device 10 according to one or more embodiments includes three transistors T1, T2, and T3 and one storage capacitor Cst in addition to a light emitting diode EL.

The light emitting diode EL emits light in accordance with a current supplied through the driving transistor T1. The light emitting diode EL includes a first electrode, a second electrode, and at least one light emitting element located between the first electrode and the second electrode. The light emitting element may emit light of a corresponding wavelength range by an electrical signal transferred from the first electrode and the second electrode.

One end of the light emitting diode EL may be connected to a source electrode of the driving transistor T1, and the other end thereof may be connected to the second voltage line VSL supplied with a low potential voltage (hereinafter, second power voltage) that is lower than a high potential voltage (hereinafter, first power voltage) of the first voltage line VDL. Further, the other end of the light emitting diode EL may be connected to a source electrode of the second switching transistor T3.

The driving transistor T1 adjusts the current flowing from the first voltage line VDL to the light emitting diode EL in accordance with a voltage difference between the gate electrode and the source electrode. For example, the driving transistor T1 may drive the light emitting diode EL. The gate electrode of the driving transistor T1 may be connected to a source electrode of the first switching transistor T2, the source electrode of the driving transistor T1 may be connected to the first electrode of the light emitting diode EL, and the drain electrode of the driving transistor T1 may be connected to the first voltage line VDL to which the first power voltage is applied.

The first switching transistor T2 is turned on by a scan signal of the scan line SCL to connect the data line DTL to the gate electrode of the driving transistor T1. The gate electrode of the first switching transistor T2 may be connected to the scan line SCL, the source electrode of the first switching transistor T2 may be connected to the gate electrode of the driving transistor T1, and the drain electrode of the first switching transistor T2 may be connected to a (k)th data line DTLk (where k is an integer greater than or equal to 1).

The second switching transistor T3 is turned on by a sensing signal of the sensing line SSL to connect the initialization voltage line VIL to one end of the light emitting diode EL. A gate electrode of the second switching transistor T3 may be connected to the sensing line SSL, a drain electrode of the second switching transistor T3 may be connected to the initialization voltage line VIL, and a source electrode of the second switching transistor T3 may be connected to one end of the light emitting diode EL or to the source electrode of the driving transistor T1.

In one or more embodiments, the source electrode and the drain electrode of each of the transistors T1, T2, and T3 are not limited to those described above, and may be vice versa.

The storage capacitor Cst is formed between the gate electrode and the source electrode of the driving transistor T1. The storage capacitor Cst stores a differential voltage between the gate voltage and the source voltage of the driving transistor T1.

Each of the transistors T1, T2, and T3 may be formed of a thin film transistor. In FIG. 3, each of the transistors T1, T2, and T3 is formed of an N-type metal oxide semiconductor field effect transistor (MOSFET), but is not limited thereto. That is, each of the transistors T1, T2, and T3 may be formed of a P-type MOSFET, or some of the transistors T1, T2, and T3 may be an N-type MOSFET, and others may be formed of a P-type MOSFET.

Figure 5:
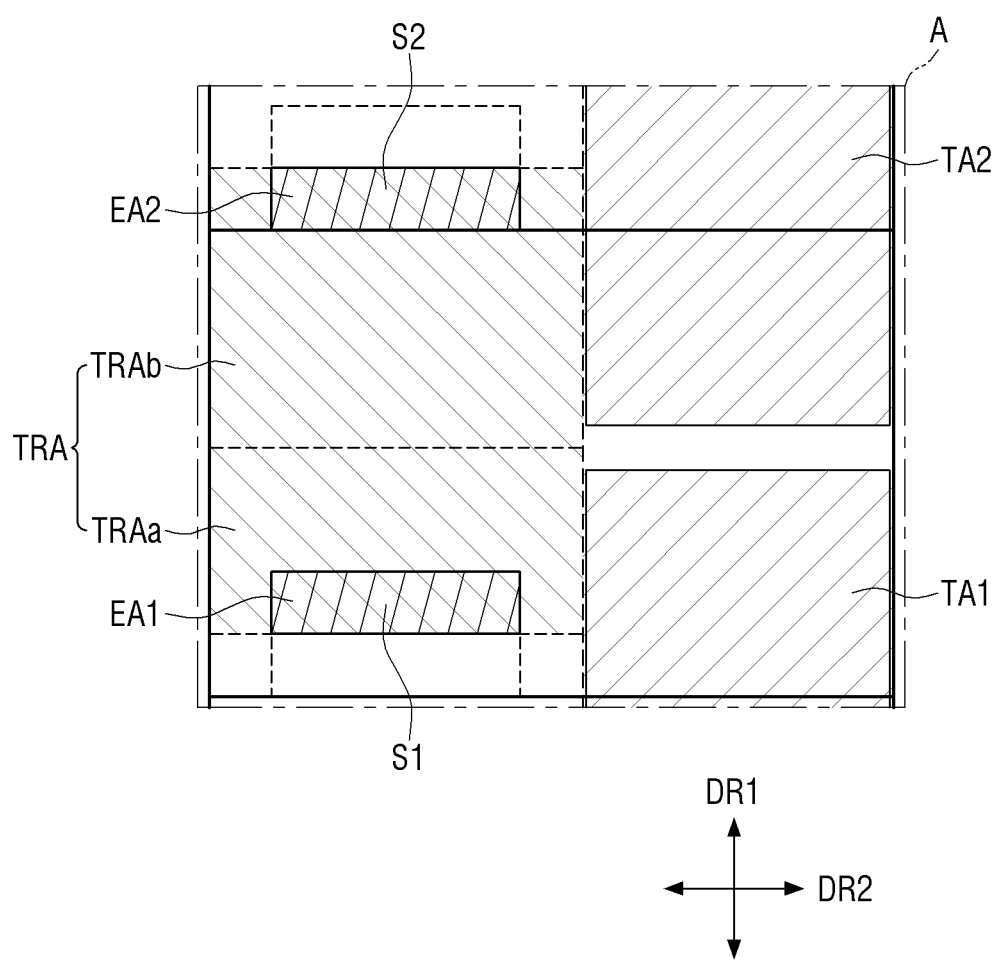
FIG. 5 is an enlarged plan view illustrating an area A of FIG. 3.
Figure 6:
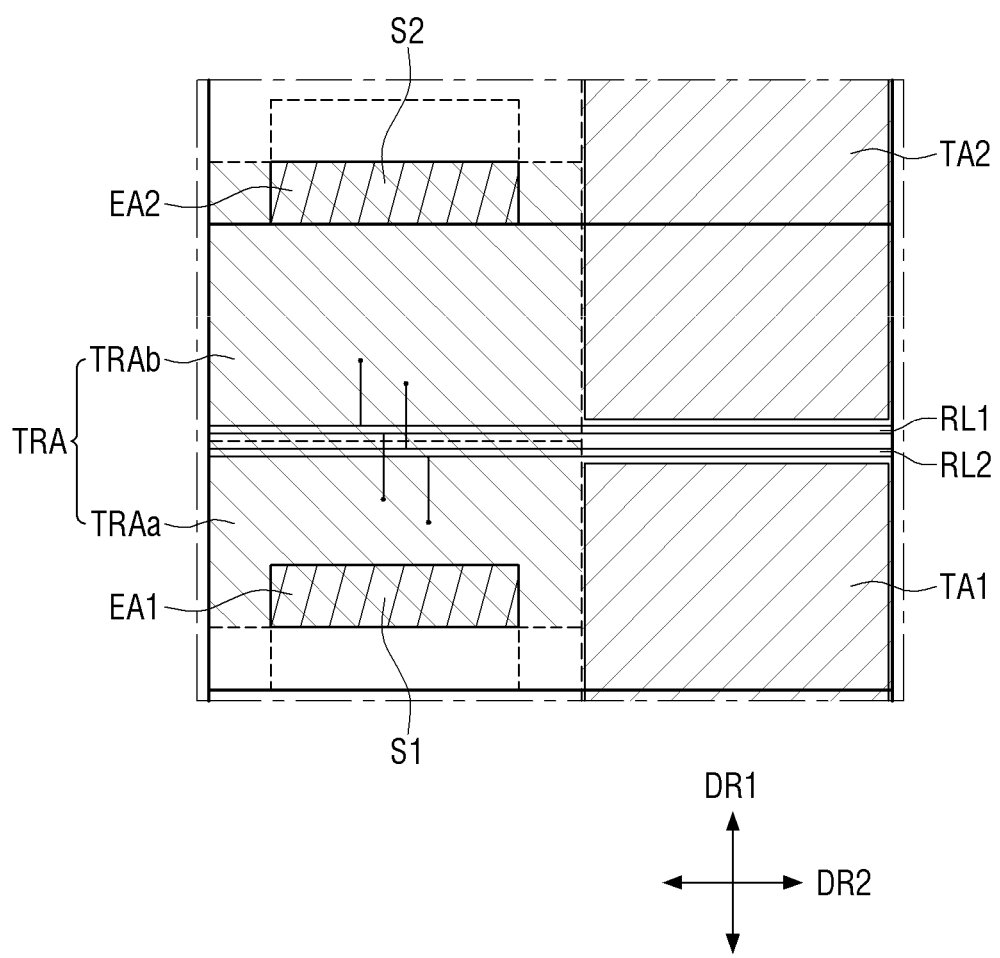
FIG. 6 is a plan view illustrating at least one line passing between a first light transmissive area and a second light transmissive area.

FIG. 5 is an enlarged plan view illustrating an area A of FIG. 3. FIG. 6 is a plan view illustrating at least one line passing between a first light transmissive area and a second light transmissive area.

Referring to FIGS. 5 and 6, the transistor area TRA may include a first transistor area TRAa that overlaps the first light emission area EA1, and a second transistor area TRAb that overlaps the second light emission area EA2. The overlap area S1 between the first light emission area EA1 and the first transistor area TRAa may be the same as the overlap area S2 between the second light emission area EA2 and the second transistor area TRAb.

The first transistor area TRAa may include a plurality of first transistors (T1 to T3 of FIG. 4) electrically connected to the first light emission area EA1, and the second transistor area TRAb may include a plurality of second transistors (T1 to T3 of FIG. 4) electrically connected to the second light emission area EA2. The first transistor area TRAa and the second transistor area TRAb may have a symmetrical shape along the column direction.

At least one line RL1 and RL2 extended along the row direction (second direction DR2 of FIG. 6), or at least one portion thereof, may be located in the transistor area TRA, and at least one line RL1 and RL2, or at least one portion thereof, may be located in the gap space.

As shown in FIG. 6, the lines RL1 and RL2 may be connected to the first transistor of the first transistor area TRAa and the second transistor of the second transistor area TRAb, respectively.

The at least one line RL1 and RL2 may be any one of the scan line SCL, the sensing line SSL and the power lines VSL and VDL of FIG. 2. For example, the first line RL1 may include a scan line SCL or a sensing line SSL, and the second line RL2 may include power lines VSL and VDL. In some embodiments, the scan line SCL and the sensing line SSL may be integrated.

According to one or more embodiments of the present disclosure, the overlap area S1 between the first light emission area EA1 and the first transistor area TRAa is the same as the overlap area S2 between the second light emission area EA2 and the second transistor area TRAb, the first transistor area TRAa and the second transistor area TRAb may have a substantially symmetrical shape along the column direction, at least one line RL1 and RL2 extended along the row direction may be located in the transistor area TRA, and at least one line RL1 and RL2 may be located in the gap space, whereby the integrated first light-transmissive area TA1 and the integrated second light-transmissive area TA2 may ensure relatively great sizes, respectively. Furthermore, because the light-transmissive areas TA1 and TA2 do not overlap any line of the display device of FIG. 7, which will be described later, light-transmissive loss may be greatly reduced.

Figure 7:
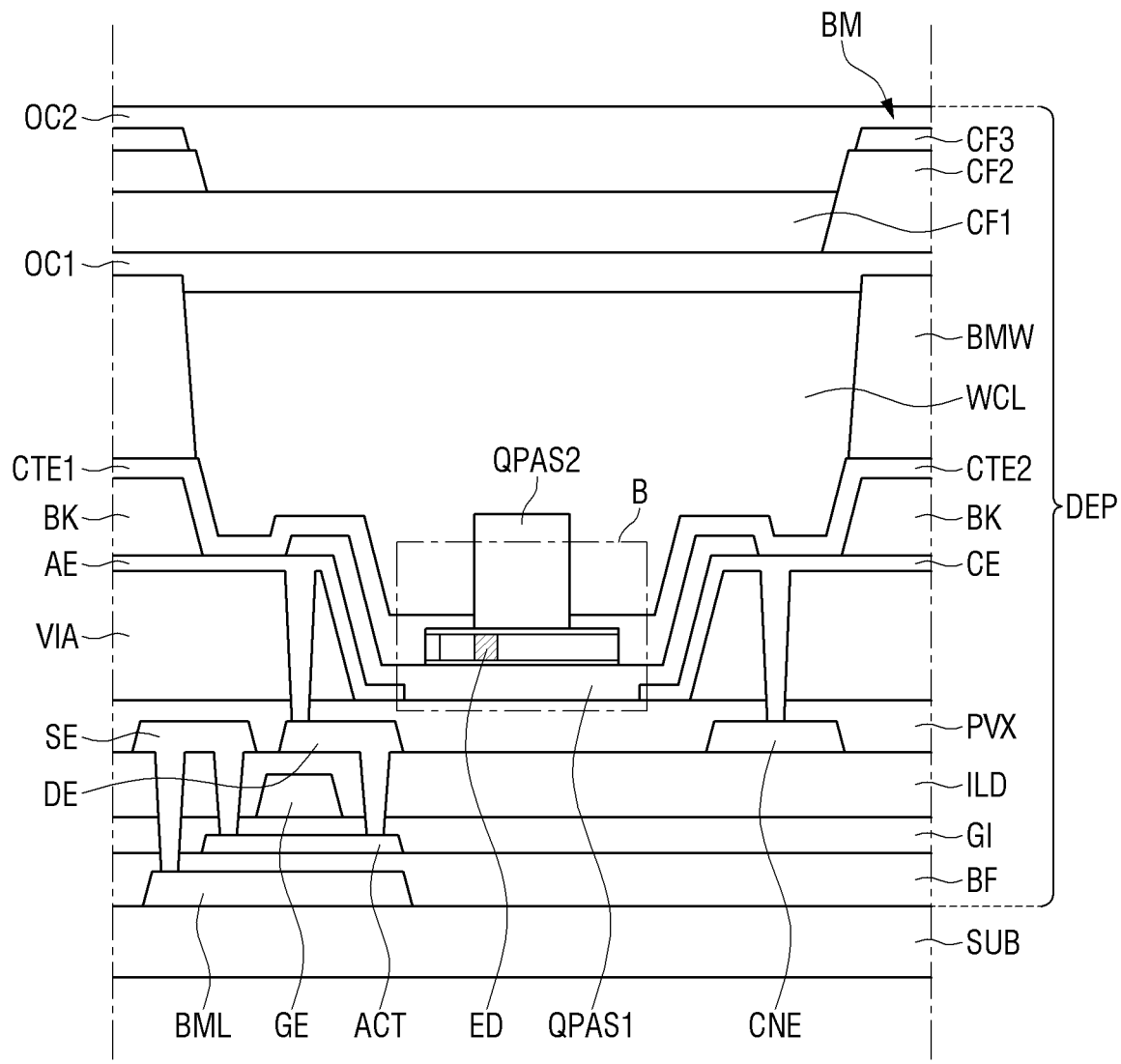
FIG. 7 is an cross-sectional view illustrating a display device according to one or more embodiments.
Figure 8:
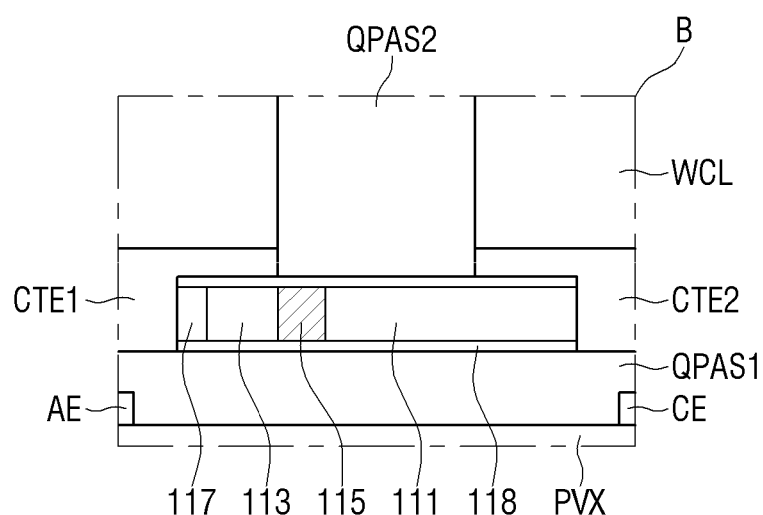
FIG. 8 is an enlarged cross-sectional view illustrating an area B of FIG. 7.
Figure 9:
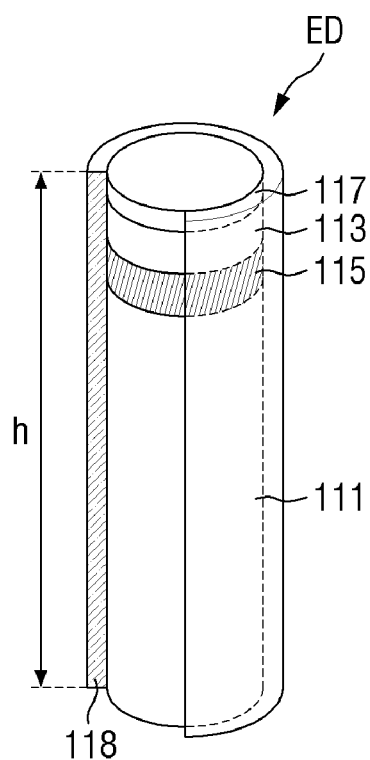
FIG. 9 is a view illustrating a light emitting element according to one or more embodiments.

FIG. 7 is an cross-sectional view illustrating a display device according to one or more embodiments. FIG. 8 is an enlarged cross-sectional view illustrating an area B of FIG. 7. FIG. 9 is a view illustrating a light emitting element according to one or more embodiments.

Referring to FIGS. 7 to 9, the display device 10 may include a substrate portion SUB, and a display element layer DEP located on the substrate portion SUB located in the display area (DPA of FIG. 1).

The substrate portion SUB may be made of an insulating material, such as a polymer resin. The insulating material may include, but is not limited to, polyimide (PI).

The display element layer DEP may include a light-shielding pattern BML, a buffer layer BF, a thin film transistor layer, a gate insulating layer GI, a first insulating layer ILD, a connection electrode CNE, a second insulating layer PVX, light emitting element layers/components VIA, AE, CE, QPAS1, ED, CTE1, CTE2, and QPAS2, wavelength conversion layers WCL and BMW, a first planarization layer OC1, color filter layers CF1 and BM, and a second planarization layer OC2.

The light-shielding pattern BML may be located on the substrate portion SUB. The light-shielding pattern BML may overlap at least one transistor of the thin film transistor layer to reduce or prevent light entering the transistor.

The buffer layer BF may be located on the substrate portion SUB and the light-shielding pattern BML. The buffer layer BF may be made of an inorganic layer capable of reducing or preventing permeation of the air or water.

The thin film transistor layer may include at least one of the transistors illustrated in FIG. 4. The driving transistor (T1 of FIG. 4) of the transistors is illustrated in FIG. 7. The driving transistor T1 may include components ACT, GE, SE and DE.

A semiconductor layer ACT may be provided on the buffer layer BF. The semiconductor layer ACT may overlap the gate electrode GE, the source electrode SE, and the drain electrode DE. The semiconductor layer ACT may be directly in contact with the source electrode SE and the drain electrode DE, and may face the gate electrode GE with the gate insulating layer GI interposed therebetween.

The gate electrode GE may be located on the gate insulating layer GI. The gate electrode GE may overlap the semiconductor layer ACT with the gate insulating layer GI interposed therebetween.

The source electrode SE and the drain electrode DE may be spaced apart from each other on the first insulating layer ILD. The source electrode SE may be in contact with one end of the semiconductor layer ACT through a contact hole provided in the gate insulating layer GI and the first insulating layer ILD. The drain electrode DE may be in contact with the other end of the semiconductor layer ACT through the contact hole provided in the gate insulating layer GI and the first insulating layer ILD. The drain electrode DE may be connected to a first electrode AE through a contact hole provided in the second insulating layer PVX. The connection electrode CNE may be located in the same layer as the source electrode SE. The connection electrode CNE may be connected to a second electrode CE through the contact hole provided in the second insulating layer PVX.

The gate insulating layer GI may be formed on the semiconductor layer ACT. For example, the gate insulating layer GI may be located on the semiconductor layer ACT and the buffer layer BF, and may insulate the semiconductor layer ACT from the gate electrode GE. The gate insulating layer GI may include, or define, a contact hole through which the source electrode SE passes, and a contact hole through which the drain electrode DE passes.

The first insulating layer ILD may be located on the gate electrode GE. For example, the first insulating layer ILD may include, or define, a contact hole through which the source electrode SE passes, and a contact hole through which the drain electrode DE passes.

The second insulating layer PVX may be provided on the thin film transistor layer to protect the thin film transistor. For example, the second insulating layer PVX may include, or define, respective contact holes through which the first electrode AE and the second electrode CE pass. The second insulating layer PVX may be, for example, a planarization layer.

On the second insulating layer PVX, layers/components VIA, AE, CE, QPAS1, ED, CTE1, CTE2, and QPAS2 may be located. The via layer VIA may be located on the second insulating layer PVX.

The first electrode AE may be formed on (e.g., above) the second insulating layer PVX. For example, the first electrode AE may be located on the via layer VIA located on the second insulating layer PVX to cover the via layer VIA. The first electrode AE may be located to overlap one of the light emission areas of the corresponding color, which are defined by the via layer VIA. The first electrode AE may be connected to the drain electrode DE of the thin film transistor.

The second electrode CE may be formed on the second insulating layer PVX. For example, the second electrode CE may be located on the via layer VIA located on the second insulating layer PVX to cover the via layer VIA. The second electrode CE may be located to overlap one of the light emission areas of the corresponding color, which are defined by the via layer VIA. For example, the second electrode CE may receive a common voltage supplied to the entire pixel.

The first element insulating layer QPAS1 may cover a portion of the first electrode AE and a portion of the second electrode CE, which are adjacent to each other, and may insulate the first electrode AE from the second electrode CE.

The light emitting element ED may be located between the first electrode AE and the second electrode CE on the second insulating layer PVX. The light emitting element ED may be located on the first element insulating layer QPAS1. One end of the light emitting element ED may be connected to the first electrode AE, and the other end of the light emitting element ED may be connected to the second electrode CE. For example, the plurality of light emitting elements ED may include active layers having the same material to emit light of the same wavelength band or light of the same color. The light emitted from each of the light emission areas of the corresponding color may have the same color.

A bank BK may be located on the second insulating layer PVX to define the light emission areas of the corresponding color. For example, the bank BK may surround each of the light emission areas of the corresponding color, but is not limited thereto. The bank BK may be located in the light-shielding area between the light emission areas described as above.

Each of the first and second contact electrodes CTE1 and CTE2 may cover a portion of the light emitting element ED. The first and second contact electrodes CTE1 and CTE2 may be located on the electrodes AE and CE and the bank BK.

The light emitting element ED may be electrically connected to the first electrode AE and the second electrode CE through the contact electrodes CTE1 and CTE2, respectively. The first contact electrode CTE1 may directly contact an upper surface of one end of the first element insulating layer QPAS1. The second contact electrode CTE2 may directly contact an upper surface of the other end of the first element insulating layer QPAS1.

The first contact electrode CTE1 and the second contact electrode CTE2 may be located in the same layer. Each of the first contact electrode CTE1 and the second contact electrode CTE2 may expose an upper surface of a central portion of the light emitting element ED. The second element insulating layer QPAS2 may be located on the upper surface of the central portion of the exposed light emitting element ED.

The light emitting diode ED may be a light emitting diode. For example, the light emitting element ED may have a size of a micro-meter or a nano-meter, and may be an inorganic light emitting diode that includes an inorganic material. The inorganic light emitting diode may be aligned between two electrodes facing each other in accordance with an electric field formed in a corresponding direction between two the electrodes.

The light emitting element ED may have a shape extended in one direction. The light emitting element ED may have a shape, such as a rod, a wire, and a tube. As shown in FIG. 8, the light emitting element ED may include a first semiconductor layer 111, a second semiconductor layer 113, an active layer 115, an electrode layer 117, and an insulating layer 118. A length h of the light emitting element ED may be about 4 µm.

The first semiconductor layer 111 may be an n-type semiconductor. The first semiconductor layer 111 may include a semiconductor material having a chemical formula of AlxGayIn1-x-yN ($0 \leq x \leq 1$, $0 \leq y \leq 1$, $0 \leq x+y \leq 1$). For example, the first semiconductor layer 111 may include at least one n-type doped semiconductor material of AlGaInN, GaN, AlGaN, InGaN, AlN or InN. The first semiconductor layer 111 may be doped with an n-type dopant, such as Si, Ge and Sn. For example, the first semiconductor layer 111 may be n-GaN doped with an n-type Si. The first semiconductor layer 111 may have a thickness ranging from about 500 nm to about 1 μm, but is not limited thereto.

The second semiconductor layer 113 may be a p-type semiconductor, and include a semiconductor material having a chemical formula of AlxGayIn1-x-yN ($0 \leq x \leq 1$, $0 \leq y \leq 1$, $0 \leq x+y \leq 1$). For example, the second semiconductor layer 113 may include at least one p-type doped semiconductor material of AlGaInN, GaN, AlGaN, InGaN, AlN or InN. The second semiconductor layer 113 may be doped with a p-type dopant, such as Mg, Zn, Ca, and Ba. For example, the second semiconductor layer 113 may be p-GaN doped with a p-type Mg. The second semiconductor layer 113 may have a thickness ranging from about 30 nm to about 200 nm.

The active layer 115 may be located between the first semiconductor layer 111 and the second semiconductor layer 113. The active layer 115 may emit light by recombination of electron-hole pairs in accordance with a light emission signal applied through the first and second semiconductor layers 111 and 113. The active layer 115 may include a material of a single or multiple quantum well structure. When the active layer 115 includes a material of a multiple quantum well structure, a plurality of well layers and a plurality of barrier layers may be alternately stacked. For example, the active layer 115 may have a stacked structure in which semiconductor materials of a big band gap energy and semiconductor materials of a small band gap energy are alternately stacked, and may include different group III to group V semiconductor materials depending on a wavelength range of light that is emitted.

A superlattice layer may be further located between the active layer 115 and the first semiconductor layer 111. The superlattice layer may mitigate stress due to a difference in lattice constants between the first semiconductor layer 111 and the active layer 115. For example, the superlattice layer may be formed of InGaN or GaN. A thickness of the superlattice layer may be about 50 nm to about 200 nm, approximately.

The wavelength conversion layers WCL and BMW may be located on the contact electrodes CTE1 and CTE2 and the second element insulating layer QPAS2.

The light-shielding member BMW may overlap the bank BK in a thickness direction. The light-shielding member BMW may shield transmission of light. The light-shielding member BMW may include an organic light-shielding material and a liquid-repellent component.

The wavelength conversion layer WCL may be located in each of the light emission areas of the corresponding color. The wavelength conversion layer WCL may be surrounded by the light-shielding member BMW. The wavelength conversion layer WCL may include a base resin, a scatterer, and a wavelength shifter, or may be omitted in one or more embodiments.

The base resin may include a material having relatively high light transmittance. The base resin may be made of a transparent organic material. For example, the base resin may include at least one of epoxy-based resin, acrylic-based resin, cardo-based resin or imide-based resin.

The scatterer may have a refractive index that is different from that of the base resin, and may form an optical interface with the base resin.

The wavelength shifter may convert or shift a peak wavelength of incident light to a corresponding peak wavelength. For example, the wavelength shifter may convert blue light provided by the display device into red light having a single peak wavelength ranging from about 610 nm to about 650 nm, or into green light having a single peak wavelength ranging from about 510 nm to about 550 nm, and may emit the converted light. The wavelength shifter may be a quantum dot, a quantum rod or a fluorescent body. The quantum dot may be a granular material for allowing electrons to emit a corresponding color when the electrons are transited from a conduction band to a valence band.

The first planarization layer OC1 may be located on the wavelength conversion layers WCL and BMW to planarize upper ends of the wavelength conversion layers WCL and BMW. The first planarization layer OC1 may include an organic material.

Color filter layers CF1 and BM may be located on the first planarization layer OC1.

The color filter layers CF1 and BM may include color filters and a black matrix BM. The color filters may be located in each of the light emission areas of the corresponding color on the first planarization layer OC1. The color filters may include a red color filter CF1, a green color filter CF2, and a blue color filter CF3. The black matrix BM may be comprised of a first color filter CF1, a second color filter CF2, and a third color filter CF3, which are sequentially stacked in a thickness direction.

The first color filter CF1 may overlap the wavelength conversion layer WCL in the thickness direction. The first color filter CF1 may selectively transmit light (e.g., red light) of a first color, and may shield or absorb light of a second color (e.g., green light) and light of a third color (e.g., blue light).

The first to third color filters CF1, CF2, and CF3 may attenuate reflective light due to external light by absorbing a portion of light incident from the outside of the display device. Therefore, the first to third color filters CF1, CF2, and CF3 may reduce or prevent color distortion due to external light reflection from occurring.

The second planarization layer OC2 may cover the color filters and the black matrix BM.

In one or more embodiments, an encapsulation member may be further located on the second planarization layer OC2. For example, the encapsulation member may include at least one inorganic layer to reduce or prevent permeation of oxygen or water. The encapsulation member may also include at least one organic layer to protect the display device from particles, such as dust.

Figure 10:
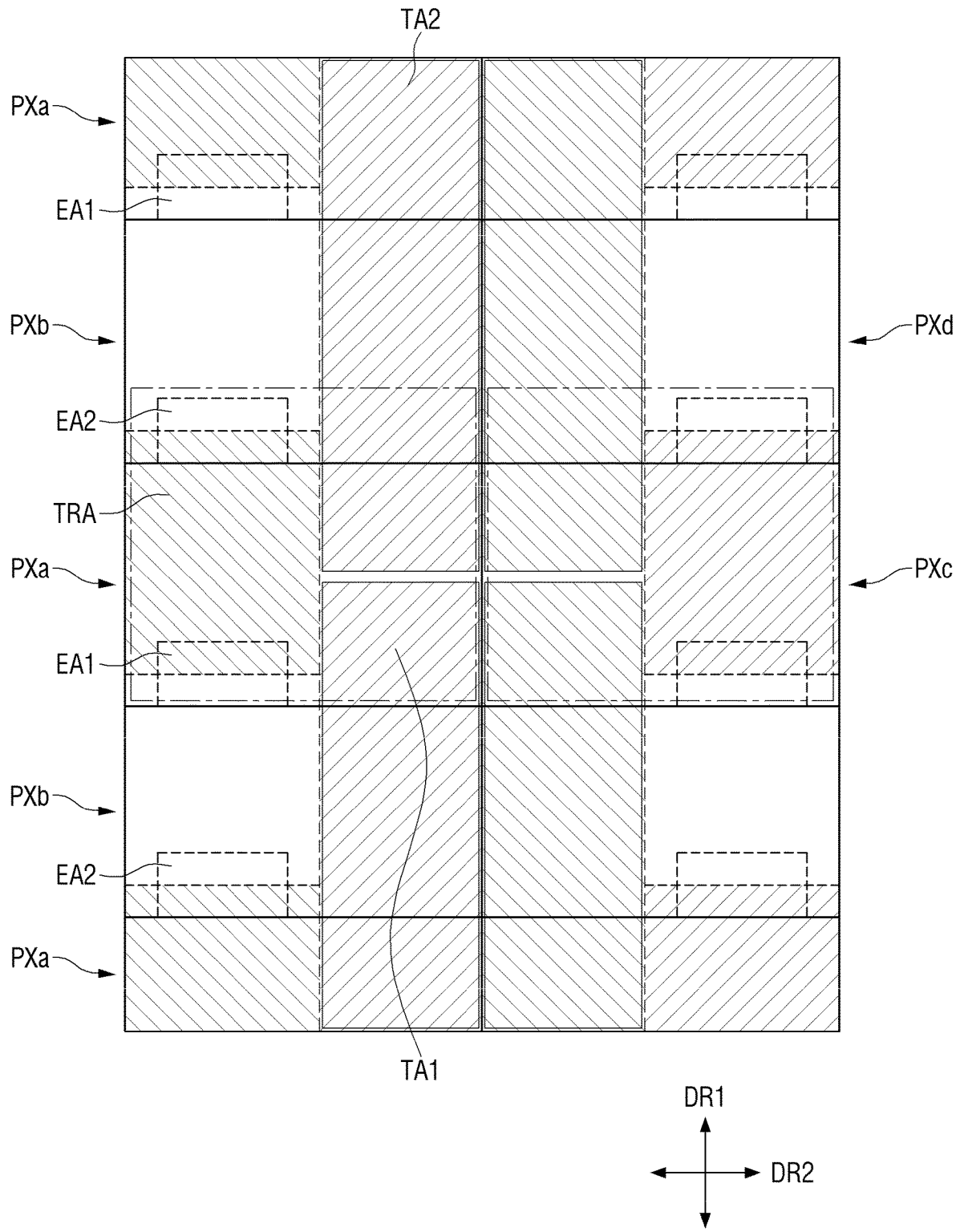
FIG. 10 is a detailed plan view illustrating a first pixel, a second pixel, a third pixel and a fourth pixel according to one or more other embodiments.

FIG. 10 is a detailed plan view illustrating a first pixel, a second pixel, a third pixel, and a fourth pixel according to one or more other embodiments.

Referring to FIG. 10, the pixel PX is different from the pixels PX of the display device shown in FIG. 3 in that the pixel PX further includes a third pixel PXc and a fourth pixel PXd, which are respectively substantially symmetrical to the pixels PXa and PXb along a row direction (second direction DR2), and also includes a first pixel PXa including a first light emission area EA1, and a second pixel PXb adjacent to the first pixel PXa in the column direction (first direction DR1 of FIG. 10) and including a second light emission area EA2.

In more detail, the third pixel PXc may have a structure that is completely substantially symmetric to the first pixel PXa in the row direction, and the fourth pixel PXd may have a structure that is completely substantially symmetrical to the second pixel PXb in the row direction.

The third pixel PXc and the fourth pixel PXd may be repeatedly located along the column direction.

A detailed configuration of the third pixel PXc and the fourth pixel PXd may be the same as that of the first and second pixel PXa and PXb described above. Therefore, the detailed description of the third and fourth pixels PXc and PXd will be omitted.

According to one or more embodiments of the present disclosure, the overlap area between the first light emission area EA1 and the first transistor area TRAa is the same as the overlap area between the second light emission area EA2 and the second transistor area TRAb. The first transistor area TRAa and the second transistor area TRAb may have a symmetrical shape along the column direction. At least one line RL1 and RL2 extending along the row direction (second direction DR2 of FIG. 6) may be located in the transistor area TRA, and at least one line RL1 and RL2 may be located in the gap space, whereby the integrated first light-transmissive area TA1 and the integrated second light-transmissive area TA2 may make sure of great sizes, respectively. Furthermore, the third pixel PXc has a structure that is completely substantially symmetrical to the first pixel PXa in the row direction, and the fourth pixel PXd has a structure that is completely substantially symmetrical to the second pixel PXb in the row direction, so that respective ones of the light-transmissive areas TA1 and TA2 adjacent to each other in the row direction may have an integrated structure, whereby the integrated first light-transmissive area TA1 and the integrated second light-transmissive area TA2 may allow sizes that are greater than the sizes of the light-transmissive areas TA1 and TA2 shown in FIG. 3. Furthermore, because the light-transmissive areas TA1 and TA2 of FIG. 10 do not overlap any line of the display device of FIG. 7, light-transmissive loss may be greatly reduced.

In concluding the detailed description, those skilled in the art will appreciate that many variations and modifications can be made to the disclosed embodiments without substantially departing from the aspects of the present disclosure. Therefore, the disclosed embodiments are used in a generic and descriptive sense only and not for purposes of limitation.

What is claimed is:

1. A display device comprising:
a first pixel comprising a first light emission area;
a second pixel adjacent to the first pixel in a column direction, and comprising a second light emission area;
a transistor area overlapped with each of the first pixel and the second pixel, and coupled to the first light emission area and the second light emission area, such that at least some transistors of the first pixel and of the second pixel are between the first light emission area and the second light emission area in plan view; and
a light-transmissive area adjacent to the transistor area in a row direction crossing the column direction.

2. The display device of claim 1, wherein the transistor area overlaps the first light emission area and the second light emission area.

3. The display device of claim 2, wherein the transistor area comprises a first transistor area overlapped with the first light emission area, and a second transistor area overlapped with the second light emission area.

4. The display device of claim 3, wherein an overlap area between the first light emission area and the first transistor area has a same size as a size of an overlap area between the second light emission area and the second transistor area.

5. The display device of claim 4, wherein the first transistor area comprises first transistors electrically connected to the first light emission area, and wherein the second transistor area comprises second transistors electrically connected to the second light emission area.

6. The display device of claim 5, wherein the light-transmissive area comprises a first light-transmissive area, and a second light-transmissive area adjacent to the first light-transmissive area in the column direction.

7. The display device of claim 6, wherein the first light-transmissive area and the second light-transmissive area are spaced apart from each other with a gap space therebetween.

8. The display device of claim 7, further comprising at least one line extending along the row direction in the transistor area and in the gap space.

9. The display device of claim 8, wherein the at least one line is connected to one of the first transistors or one of the second transistors.

10. The display device of claim 9, wherein the at least one line comprises a scan line or a power line.

11. The display device of claim 3, wherein the first transistor area and the second transistor area have a symmetrical shape along the column direction.

12. The display device of claim 1, wherein the first pixel and the second pixel are repeatedly arranged along the column direction.

13. A display device comprising:
a first pixel comprising a first light emission area;
a second pixel adjacent to the first pixel in a column direction, and comprising a second light emission area;
a transistor area overlapped with each of the first pixel and the second pixel, and coupled to the first light emission area and the second light emission area; and
a light-transmissive area adjacent to the transistor area in a row direction crossing the column direction,
wherein the transistor area overlaps the first light emission area and the second light emission area,
wherein the transistor area comprises a first transistor area overlapped with the first light emission area, and a second transistor area overlapped with the second light emission area,
wherein an overlap area between the first light emission area and the first transistor area has a same size as a size of an overlap area between the second light emission area and the second transistor area,
wherein the first transistor area comprises first transistors electrically connected to the first light emission area,
wherein the second transistor area comprises second transistors electrically connected to the second light emission area,
wherein the light-transmissive area comprises a first light-transmissive area, and a second light-transmissive area adjacent to the first light-transmissive area in the column direction,
wherein the first light-transmissive area and the second light-transmissive area are spaced apart from each other with a gap space therebetween,
wherein the first pixel comprises a portion of the first light-transmissive area and a first portion of the second light-transmissive area, and
wherein the second pixel comprises a second portion of the second light-transmissive area.

14. A display device comprising:
a first pixel comprising a first light emission area;
a second pixel adjacent to the first pixel in a column direction, and comprising a second light emission area;

a first transistor area comprising a (1-1)th transistor area overlapped with the first light emission area, and a (1-2)th transistor area overlapped with the second light emission area; and a first light-transmissive area adjacent to the first transistor area in a row direction crossing the column direction, and comprising a (1-1)th light-transmissive area; and a second light-transmissive area comprising a (2-1)th light-transmissive area adjacent to the (1-1)th light-transmissive area in the column direction, and spaced from the (1-1)th light-transmissive area with a gap space therebetween, wherein the first pixel further comprises a portion of the first light-transmissive area, a first portion of the second light-transmissive area, and the (1-1)th transistor area, and wherein the second pixel further comprises a second portion of the second light-transmissive area, and the (1-2)th transistor area.

15. The display device of claim 14, wherein an overlap area between the first light emission area and the (1-1)th transistor area has a same size as a size of an overlap area between the second light emission area and the (1-2)th transistor area.

16. The display device of claim 15, further comprising at least one line extending along the row direction in the first transistor area and in the gap space.

17. The display device of claim 16, wherein the at least one line is connected to a first transistor of the (1-1)th transistor area or a second transistor of the (1-2)th transistor area, and comprises a scan line or a power line.

18. The display device of claim 17, further comprising:
a third pixel comprising a third light emission area;
a fourth pixel adjacent to the third pixel in the column direction, and comprising a fourth light emission area; and
a second transistor area comprising a (2-1)th transistor area overlapped with the third light emission area, and a (2-2)th transistor area overlapped with the fourth light emission area, wherein the first light-transmissive area and the second light-transmissive area respectively further comprise a (1-2)th light-transmissive area and (2-2)th light-transmissive area adjacent to the second transistor area in the row direction.

19. The display device of claim 18, wherein the (1-2)th light-transmissive area and the (2-2)th light-transmissive area are adjacent to each other in the column direction, and spaced apart from each other, wherein the third pixel further comprises a portion of the (1-2)th light-transmissive area and a first portion of the (2-2)th light-transmissive area, and wherein the fourth pixel further comprises a second portion of the (2-2)th light-transmissive area.

20. The display device of claim 19, wherein the first pixel and the second pixel are repeatedly arranged along the column direction, wherein the third pixel and the fourth pixel are repeatedly arranged along the column direction, and wherein an arrangement of the first pixel and the second pixel and an arrangement of the third pixel and the fourth pixel have a substantially symmetrical shape along the row direction.

* * * * *